United States Patent
Ohta et al.

[11] Patent Number: 6,035,712
[45] Date of Patent: Mar. 14, 2000

[54] SENSOR DEVICE AND METHOD OF PRODUCING THE SAME USING LEAD FRAME

[75] Inventors: Tameharu Ohta, Nishio; Hiromi Ariyoshi, Kariya, both of Japan

[73] Assignee: Denso Corporation, Kariya, Japan

[21] Appl. No.: 09/038,906

[22] Filed: Mar. 12, 1998

[30] Foreign Application Priority Data

Mar. 14, 1997 [JP] Japan .................................. 9-060867

[51] Int. Cl.⁷ .................................................. G01P 1/02
[52] U.S. Cl. ................................................................ 73/493
[58] Field of Search .......................... 73/493, 431, 866.5, 73/514.32, 777, 756, 856, 514.01, 514.16, 514.36, 514.37, 514.34; 174/52.1, 52.2, 52.3, 52.4

[56] References Cited

U.S. PATENT DOCUMENTS

| | | | |
|---|---|---|---|
| 4,446,375 | 5/1984 | Aird ......................................... | 250/551 |
| 4,891,984 | 1/1990 | Fujii et al. ................................ | 73/651 |
| 5,233,871 | 8/1993 | Schwarz et al. .......................... | 73/493 |
| 5,389,739 | 2/1995 | Mills ........................................ | 174/52.4 |
| 5,503,016 | 4/1996 | Koen ........................................ | 73/493 |
| 5,554,806 | 9/1996 | Mizuno et al. ........................... | 73/493 |
| 5,817,941 | 10/1998 | Stalnaker et al. ......................... | 73/493 |
| 5,864,062 | 1/1999 | Nagahara et al. ........................ | 73/514.32 |

FOREIGN PATENT DOCUMENTS 5-291482   11/1993   Japan .

OTHER PUBLICATIONS

Nikkan Kougyou Shinbun: Apr. 17, 1996.
Nikkei Electronics: Jun. 2, 1997.

Primary Examiner—Hezron Williams
Assistant Examiner—Helen C. Kwok
Attorney, Agent, or Firm—Pillsbury Madison & Sutro LLP

[57] ABSTRACT

An acceleration sensor device includes a molded package mounted on a circuit board and first and second leads protruding from the molded package and joined to the circuit board. The molded package retains an island portion of a lead frame in a state where a chip mounting surface of the island portion is perpendicular to the circuit board. An acceleration sensor is mounted on the chip mounting surface of the island portion. After attaching the acceleration sensor chip to the island portion, the island portion is bent up in the lead frame. Then, the island portion, the acceleration sensor chip, and the first and second leads are integrally molded to make the molded package. Accordingly, a detection axis of the acceleration sensor device can be arbitrary set, and the molded package is stably mounted on the circuit board.

48 Claims, 9 Drawing Sheets

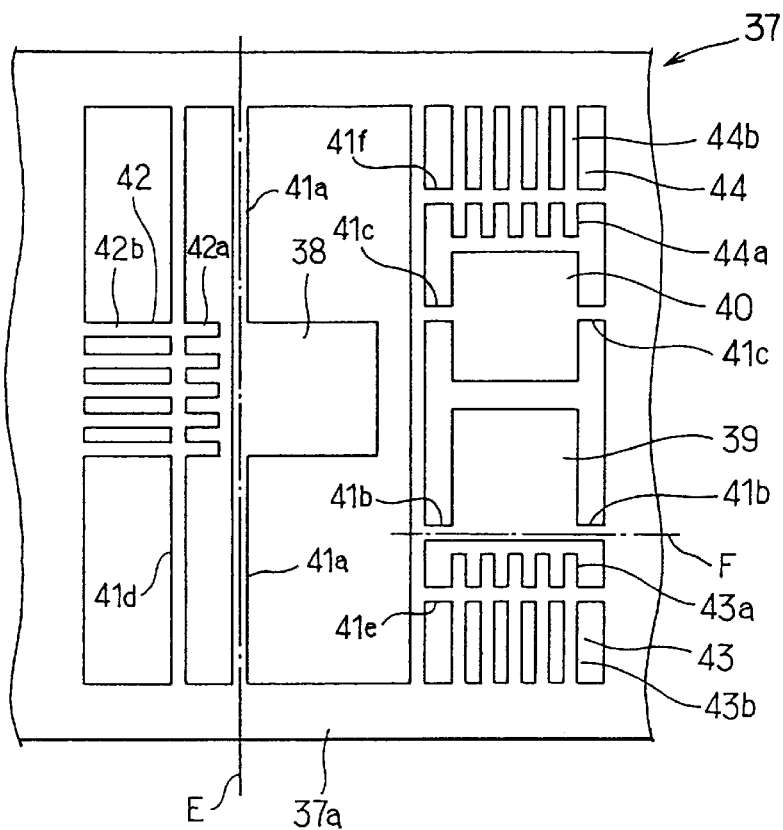
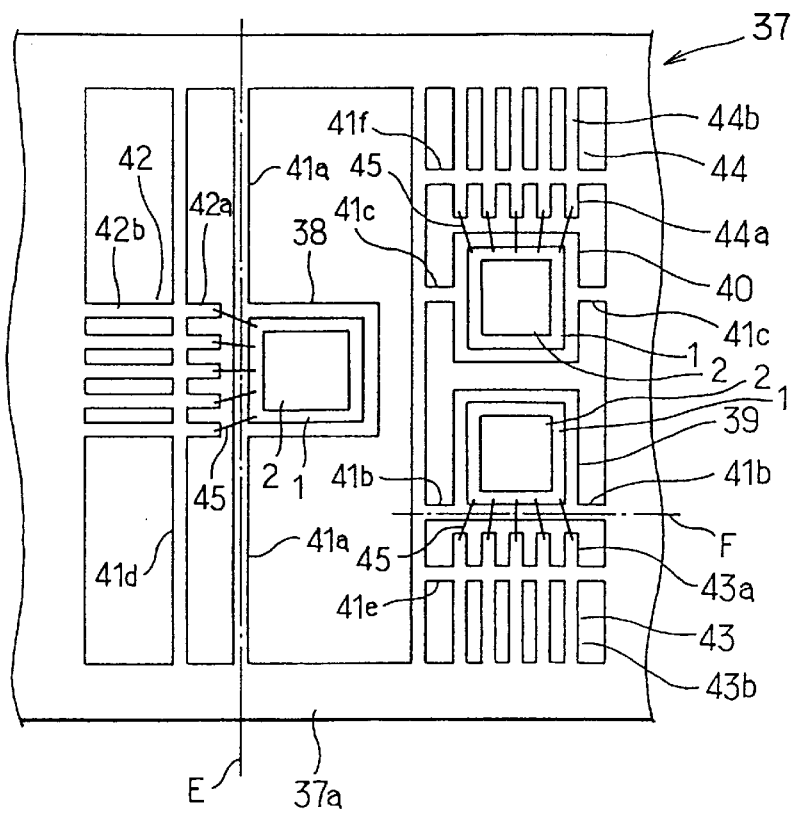

SENSOR DEVICE AND METHOD OF PRODUCING THE SAME USING LEAD FRAME

CROSS REFERENCE TO RELATED APPLICATION

This application is based upon and claims the benefit of priority of the prior Japanese Patent Application No. 9-60867 filed on Mar. 14, 1997, the contents of which are incorporated herein by reference.

BACKGROUND OF THE INVENTION

1. Field of the Invention

The present invention relates to a sensor device including a transducer chip mounted on an island portion (die pad) of a lead frame and a method of producing the sensor device. Further, the present invention relates to the lead frame used for producing the sensor device.

2. Related Arts

Conventionally, acceleration sensor devices using the piezoresistance effect to detect acceleration have an acceleration sensor chip with a detection axis perpendicular to a surface of the sensor chip. The acceleration sensor chip is retained within a package, and the package is mounted on a mounting surface of a circuit board. When there is a need for detecting acceleration in a direction parallel to the mounting surface of the circuit board, the sensor chip retained in the package is disposed on the circuit board such that the surface of the sensor chip becomes perpendicular to the mounting surface of the circuit board.

For example, JP-A-8-320341 discloses this vertical-type acceleration sensor device, in which an acceleration sensor chip is retained in a cavity of a package made of ceramic or resin, and is mounted on the circuit board such that the surface of the sensor chip is perpendicular to the circuit board. In the vertical-type acceleration sensor device, however, the manufacturing cost is high. This is because production of the package requires various processes for forming via holes in the package, filling the via holes with conductive material, printing conductive members for wiring, plating surfaces of the conductive members, and the like.

On the other hand, when producing a horizontal-type of acceleration sensor device in which the acceleration sensor chip is mounted on the circuit board such that the surface of the sensor chip is parallel to the circuit board, there is a low cost method using a lead frame and a resin molded package. Under this method, the acceleration sensor chip is mounted on an island portion of the lead frame, and is molded together with inner leads to form the package. The surface of the sensor chip is always parallel to the surface of the island portion of the lead frame. Therefore, it is difficult for the vertical-type acceleration sensor device to use the lead frame.

When an SIP (Single In-line Package), a ZIP (Zigzag In-line Package), or an SVP (Surface Vertical Package) is adopted as the package for the vertical-type acceleration sensor device, the above-mentioned method can be employed. However, the above-mentioned packages are not sufficiently stable, leading to a possibility that the packages may vary or waver from the initial mounted angle on the circuit board. As a result, reliability of the acceleration sensor device deteriorates.

SUMMARY OF THE INVENTION

The present invention has been made in view of the above-mentioned problems and a first object of the present invention is to provide a sensor device including a package stably mounted on a circuit board and capable of detecting a physical quantity in a specific direction. A second object of the present invention is to provide a method for producing the above-mentioned sensor device using a lead frame at low cost.

According to the present invention, a sensor device is manufactured using a lead frame having an island portion and a lead. The sensor device includes a circuit board, a package disposed on the circuit board, the island portion retained in the package and having a chip mounting surface making a specific angle with the circuit board, a transducer chip mounted on the chip mounting surface of the island portion, and the lead connected to the transducer chip and the circuit board. The specific angle between the chip mounting surface of -the island portion and the circuit board is determined by partially deforming the lead frame. Preferably, the specific angle is a right angle.

In the sensor device of the present invention, a detection axis of the transducer chip can be arbitrary set with respect to the circuit board. The lead can have the same type as for a horizontal-type sensor device, and be deformed into a specific shape. Accordingly, the package is easily and stably mounted on the circuit board. The package can be made of resin, resulting in low cost.

Preferably, the island portion is supported by a frame portion through a pair of tie-bars, and the tie-bars are deformed to make the specific angle between the chip mounting surface of the island portion and the frame portion, i.e., the circuit board. The tie-bars can have notch portions so that stress is locally concentrated on the notch portions when the tie-bars are deformed. The island portion may be supported by the frame portion through another auxiliary tie-bar. The auxiliary tie-bar supports the island portion when the transducer chip is attached to the island portions, and is cut before the lead frame is partially deformed.

The package of the sensor device can retain two or more island portions respectively holding transducer chips on chip mounting surfaces thereof. In this case, the chip mounting surfaces of the island portions are set to be non-parallel to each other. The chip mounting surfaces can be set to be perpendicular to each other. Accordingly, multidimensional sensor devices can be easily obtained.

The lead frame can have first and second leads disposed on both sides of the island portion after the lead frame is partially deformed. The first and second leads and the island portion are integrally molded from resin to form the package. In this case, the first and second leads protrude from both sides of the package and are joined to the circuit board with specific shapes to securely support the package on the circuit board.

BRIEF DESCRIPTION OF THE DRAWINGS

These and other objects and features of the present invention will become more readily apparent from a better understanding of preferred embodiments described below with reference to the following drawings, wherein:

FIG. 15 is a plan view showing a lead frame in a eighth embodiment; and

FIG. 16 is a plan view showing a state of the lead frame in a process of forming an acceleration sensor device in the eighth embodiment.

DETAILED DESCRIPTION OF THE PREFERRED EMBODIMENTS (First Embodiment)

Figure 1:
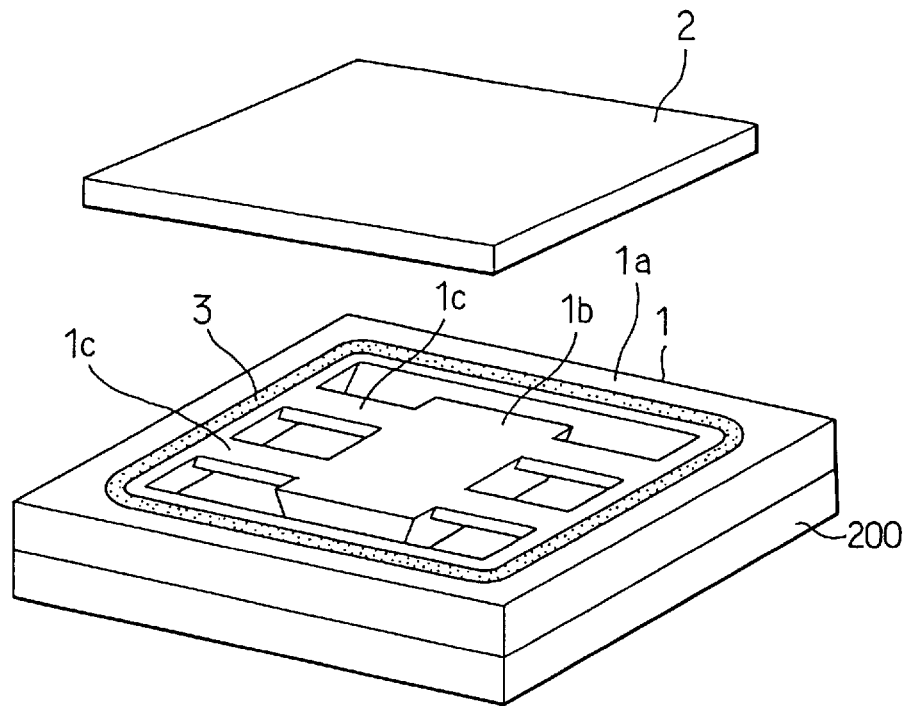
FIG. 1 is an exploded perspective view showing an acceleration sensor chip, a protection cap, and a base in a first embodiment.

As shown in FIG. 1, an acceleration sensor chip 1 employed in a first preferred embodiment as a transducer chip has a well-known structure for utilizing a piezoresistance effect and has a physical quantity (acceleration) detection axis perpendicular to a surface of the acceleration sensor chip 1. The acceleration sensor chip 1 is formed by, for example, electrochemically etching a silicon single crystal substrate to have a frame 1a, a weight portion 1b provided in the frame 1a, and four beams 1c provided symmetrically on both sides of the weight portion 1b to connect the weight portion 1b and the frame 1a. The beams 1c have resistive elements (not shown) thereon respectively, which can be formed by a diffusion method or the like. The resistive elements form strain gauges to detect the acceleration.

The thus constructed acceleration sensor chip 1 is covered with a plate-like protection cap 2 for preventing mold resin (described later) from contacting a moving portion (the weight portion 1b and the beams 1c) of the sensor chip 1. Further, a base 200 made of silicon or glass is joined to the sensor chip 1 on an opposite side of the protection cap 2. Specifically, the protection cap 2 is fixed to the frame 1a of the sensor chip 1 by an adhesive 3 not to restrict movement of the moving portion. At the same time, the protection cap 2 needs to serve as a stopper for preventing the beams 1c from being damaged by excessive movement of the moving portion. Therefore, an adhesive including beads made of resin, a soft solder material, or the like, which is capable of serving as a spacer, is employed as the adhesive 3. The protection cap 2 is preferably made of the same material as the sensor chip 1 or material having the same thermal expansion coefficient as the sensor chip 1. The adhesive 3 is preferably made of material having a thermal expansion coefficient similar to that of the sensor chip 1 and having a relatively small Young's modulus.

Figure 2:
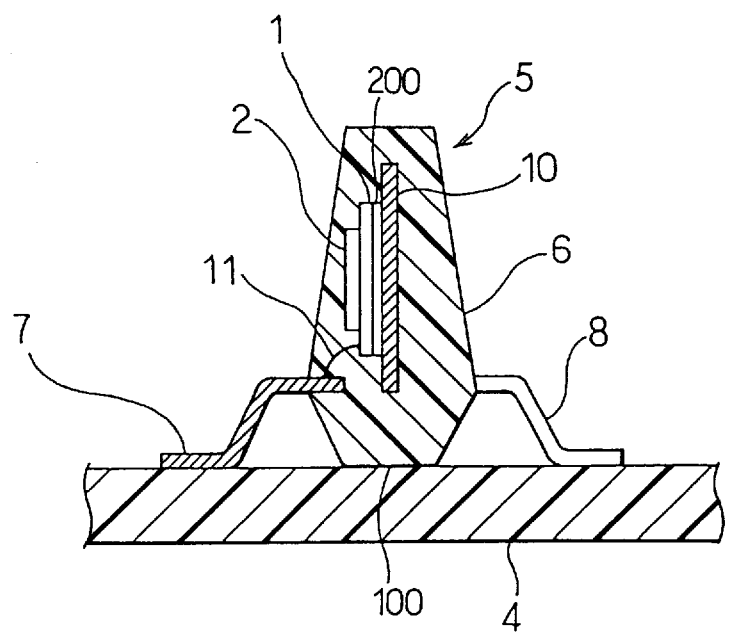
FIG. 2 is a cross-sectional view showing an acceleration sensor device in the first embodiment.
Figure 3:
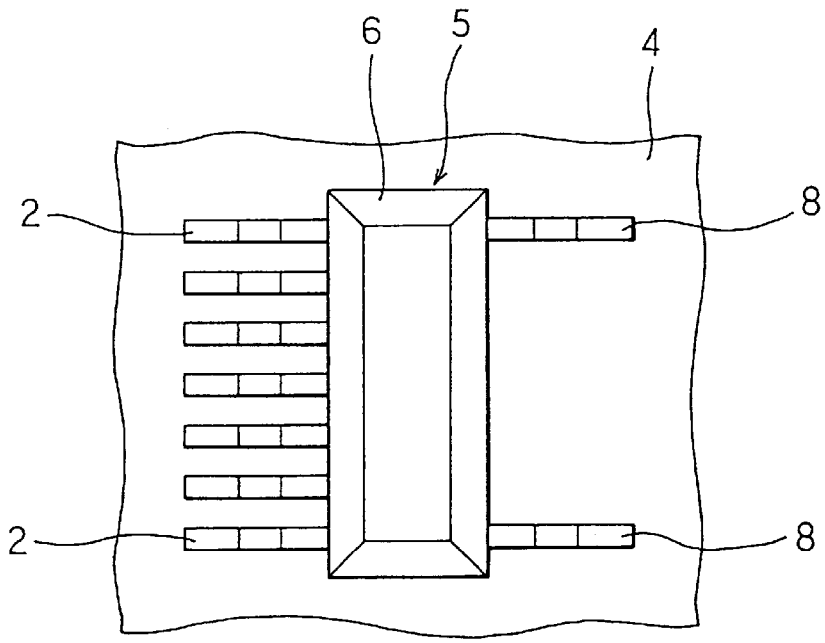
FIG. 3 is a plan view showing the acceleration sensor device in the first embodiment.

An acceleration sensor device 5 shown in FIGS. 2 and 5 includes the sensor chip 1 combined with the protection cap 2 and the base 200. Specifically, the acceleration sensor chip 1 is retained in a resin molded package 6 and is mounted on a circuit board 4. The molded package 6 has seven wires of first leads 7 protruding from a base portion thereof and a pair of wires of second leads 8 protruding from the base portion thereof on an opposite side of the first leads 7. The first and second leads 7 and 8 are formed into a Gullwing shape, which is usually employed for a lead for an SOP (Small Out-line package). The first and second leads 7 and 8 are joined to the circuit board 4 by solder (not shown), so that the molded package 6 is mounted on the circuit board 4.

The molded package 6 is formed from , for example, epoxy resin, silicone resin, hybrid resin of the epoxy and silicone resins, or the like, to have a molded side face 100 that is to face the circuit board 4. Further, an island portion 10 of a lead frame 9 (see FIG. 4) is disposed within the molded package 6 so that a chip mounting surface of the island portion 10 is substantially perpendicular to a mounting surface of the circuit board 4. The acceleration sensor chip 1 combined with the protection cap 2 and the base 200 is mounted on the island portion 10 by die bonding, and is electrically connected to the first leads 7 through bonding wires 11. That is, it should be noted that the acceleration sensor chip 1 is disposed within the molded package 6 with the physical value detection axis parallel to the mounting surface of the circuit board 4.

Figure 4:
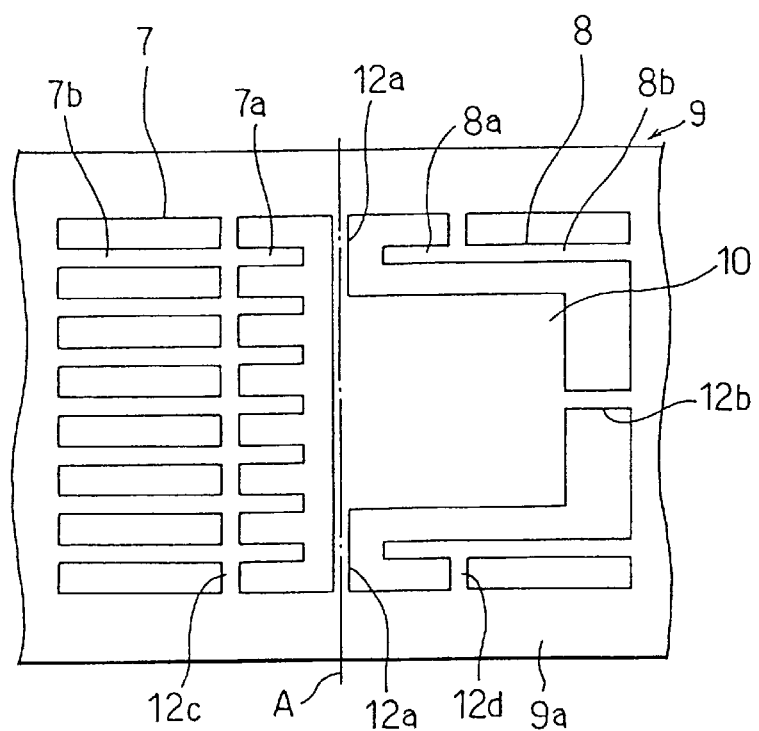
FIG. 4 is a plan view showing a lead frame in the first embodiment.

As shown in FIG. 4, the lead frame 9 used for producing the acceleration sensor device 5 includes the first and second leads 7 and 8, as well as the island portion 10. In the lead frame 9, the island portion 10 has a rectangular shape and is supported by a frame 9a through a pair of tie-bars 12a and an auxiliary tie-bar 12b. The pair of tie-bars 12a are disposed on a dashed line A in FIG. 4 parallel to a side of the island portion 10 to protrude from both ends of the side of the island portion 10 in directions opposite to each other. The auxiliary tie-bar 12b is disposed at approximately a central portion of an opposite side of the island portion 10 to protrude from the island portion 10 in a direction perpendicular to the tie-bars 12a.

The first leads 7 are respectively composed of inner leads 7a and outer leads 7b. In the lead frame 9, the first leads 7 are supported by (connected to) the frame 9a on a front end side thereof, i.e., on an outer lead side thereof, while facing the side of the island portion 10 having the tie-bars 12a, on a base end side thereof, i.e., on an inner lead side thereof. The first leads 7 are additionally supported by the frame 9a through several tie-bars 12c.

The second leads 8 are also respectively composed of inner leads 8a and outer leads 8b. The second leads 8 are supported by the frame 9a on a front end side thereof, i.e., on an outer lead side thereof, and elongate from the frame 9 to portions adjacent to the tie-bars 12a in a direction perpendicular to the tie-bars 12a on both sides of the island portion 10. The second leads 8 are additionally supported by the frame 9a through tie-bars 12d.

Figure 5A:
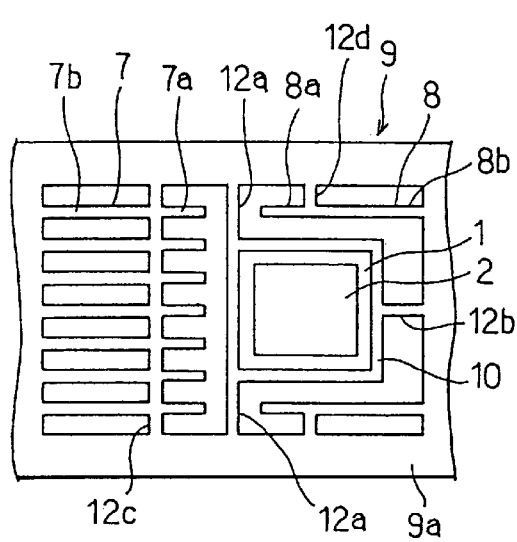
FIGS. 5A to 5E are plan views for explaining the process of forming the acceleration sensor device.

Next, processes for forming the acceleration sensor device 5 using the lead frame 9 will be described with reference to FIGS. 5A to 5D. Firstly, as shown in FIG. 5A, the acceleration sensor chip 1 combined with the protection cap 2 and the base 200 is mounted on the island portion 10 of the lead frame 9 by a die bonding process. In this process, a joining material is used for joining the acceleration sensor chip 1 to the island portion 10. Preferably, the joining material has a thermal expansion coefficient approximately the same as that of the acceleration sensor chip 1 and a relatively small Young's modulus. For example, a silicone-system joining material can be employed in this process.

Figure 5B:
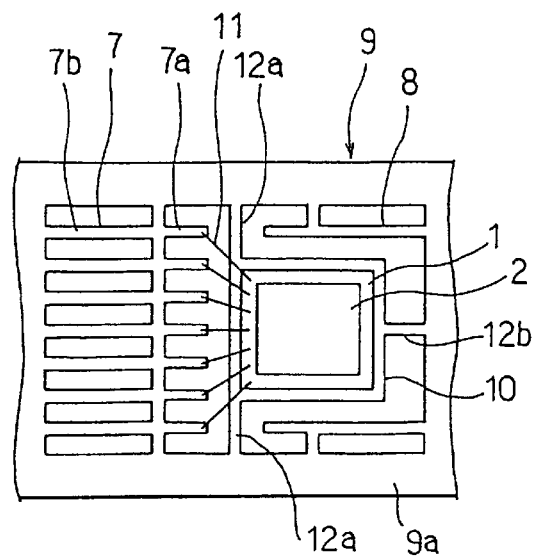

Next, as shown in FIG. 5B, the inner leads 7a of the first leads 7 are electrically connected to corresponding bonding pads (not shown) provided on the acceleration sensor chip 1 through the bonding wires 11 by a wire bonding process. The bonding pads of the acceleration sensor chip 1 is preferably provided as close as possible to the inner leads 7a when the acceleration sensor chip 1 is mounted on the island portion 10. In this embodiment, the bonding pads are provided at positions adjacent to the dashed line A connecting the tie-bars 12a (see FIG. 4) and slightly inside of the island portion 10 from an outer circumference of the island portion 10. The wire bonding process can adopt thermo-compression bonding or the like. In the thermo-compression bonding, ultrasonics may be utilized.

Figure 5C:
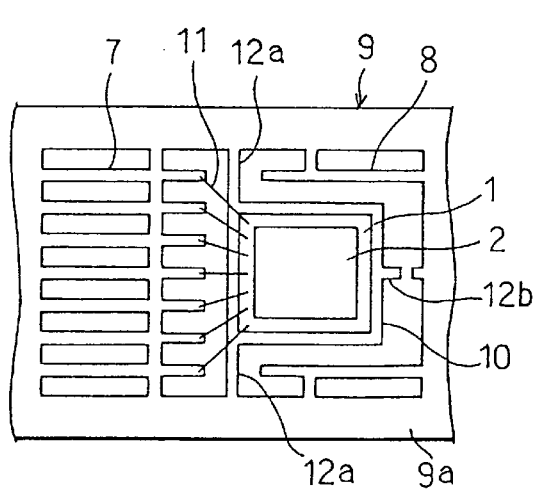
Figure 5D:
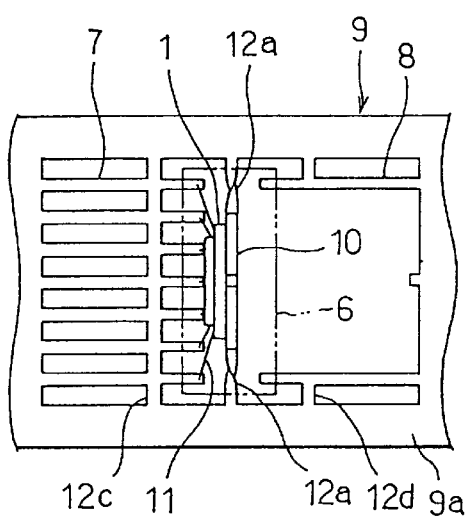

Then, as shown in FIG. 5C, in a cutting process, the auxiliary tie-bar 12b is cut. Further, as shown in FIG. 5d, in a bending process, the island portion 10 is bent up around the dashed line A connecting the tie-bars 12a such that the chip mounting surface of the island portion 10 becomes perpendicular to the mounting surface of the circuit board 4. In this case, the tie-bars 12a are distorted to allow the island portion 10 to be bent up. As mentioned above, the bonding pads of the acceleration sensor chip 1 are provided slightly inside of the island portion 10 from the outer circumference of the island portion 10. Therefore, distances between the bonding pads and the corresponding inner leads 7a decrease by the bending process to reduce tension applied to the bonding wires 11. Because of this, the bonding wires 11 are deformed, but not broken by the bending process. Each length of the bonding wires 11 and each interval between two adjacent bonding wires 11 are adequately and previously designed to prevent short circuit of the bonding wires 11.

Figure 5E:
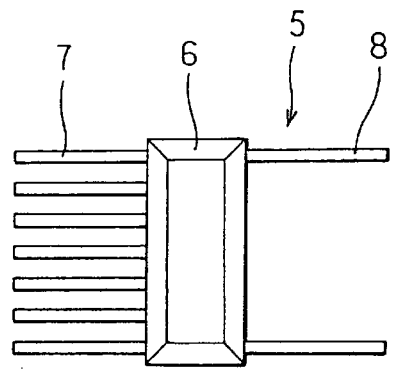

After performing the bending process, a portion indicated by a two-dot chain line in FIG. 5D is molded to form the molded package 6, while holding the island portion 10 at its position where it is determined by the bending process. This is a molding process. By the molding process, the molded side face 100 of the molded package 6, which is to face the circuit board 4 when the molded package 6 is mounted on the circuit board 4, is formed. Thereafter, a lead forming process is performed. After performing the molding process, a deburring process may be performed. In the lead forming process, as shown in FIG. 5E, the tie-bars 12a, 12c, and 12d are cut, and then are removed together with the frame 9a. Subsequently, the outer leads 7b and 8b are bent to form the Gullwing shape, thereby forming the first and second leads 7 and 8. Then, after performing a marking process to the molded package 6, an inspection process, and the like, the acceleration sensor device 5 is completed.

The above-mentioned embodiment has the following effects. First, by twisting the tie-bars 12a, the island portion 10 of the lead frame 9 is bent up around the dashed line A connecting the tie-bars 12a such that the chip mounting surface of the island portion 10 becomes perpendicular to the mounting surface of the circuit board 4. The thus constructed island portion 10 holds thereon the acceleration sensor chip 1, which has the detection axis perpendicular to the surface of the sensor chip 1 itself. Accordingly, the acceleration sensor chip 1 detects acceleration in a direction parallel to the mounting surface of the circuit board 4.

In addition, it is possible to arbitrarily change an angle between the chip mounting surface of the island portion 10 and the mounting surface of the circuit board 4. Therefore, the detection axis of the acceleration sensor chip 1 can be also arbitrarily changed with respect to the mounting surface of the circuit board 4 by controlling the angle between the island portion 10 and the mounting surface of the circuit board 4 in the bending process. For example, even in a case where the circuit board 4 cannot be installed in a vehicle in parallel with the ground, i.e., in parallel with a moving direction of the vehicle due to a limited space for installation, the detection axis of the acceleration sensor chip 1 can be set in parallel with the moving direction of the vehicle. As a result, the acceleration in the moving direction of the vehicle is accurately detected.

Further, as mentioned above, when the island portion 10 is bent up, no tension is applied to the bonding wires 11. Therefore, the connecting state of the bonding wires 11 are not adversely affected by the bonding process. Furthermore, the processes of forming the acceleration sensor device 5 in this embodiment do not restrict types of the leads 7 and 8. The acceleration sensor device 5 can adopt any types of the leads suitable for a horizontal type package structure that has stability at a mounted state. In the first embodiment, the first and second leads 7 and 8 are the same type as that for the SOP. Therefore, the acceleration sensor device 5 is stably mounted on the circuit board 4. That is, the molded package 6 is not easily inclined after mounted on the circuit board 4, thereby preventing deterioration of detecting reliability of the acceleration sensor chip 1. Additionally, the molded package 6 is made of resin, resulting in low cost.

The die bonding process for mounting the acceleration sensor chips 1 on the island portion 10 and the wire bonding process to the bonding wires 11 are performed previously to the bending process of partially bending the lead frame 9. Therefore, the die bonding process and the wire bonding process can utilize ordinal manufacturing techniques to be easily performed. The island portion 10 of the lead frame 9 is supported by the frame 9a at least at three points through the tie-bars 12a and the auxiliary tie-bar 12b. Therefore, even in a case where an external force is applied to the island portion 10 during the die bonding process and the wire bonding process, the island portion 10 is kept at its initial position. As a result, the die bonding process and the wire bonding process are precisely and efficiently performed to improve reliability of the acceleration sensor device 5.

Further, when the wire bonding process uses ultrasonics, because the island portion 10 is firmly supported, energy necessary for bonding the bonding wires 11 to the inner leads 7a are efficiently transmitted to bonding interfaces between the bonding wires 11 and the inner leads 7a, resulting in a sufficient bonding strength. In addition, the cutting process for cutting the auxiliary tie-bar 12b is performed before performing the bending process. Therefore, the bending process is securely and easily performed.

Furthermore, in the lead frame 9, the second leads 8 are disposed to elongate from the side of the frame 9a facing the island portion 10 on an opposite side of the first leads 7 toward the tie-bars 12a on the both sides of the island portion 10. Therefore, the distances between the first leads 7 and the second leads 8 are controlled to be relatively small. Consequently, the size of the molded package 6 is decreased, resulting in decrease in size of the acceleration sensor device 5.

In the first embodiment, although the acceleration sensor chip 1 is disposed on the island portion 10 through the base 20, the acceleration sensor chip 1 may be directly disposed on the island portion 10 by die-bonding. In this case, it is preferable that the island portion 10 has a recess where the acceleration sensor chip 1 is to be mounted to enable the weight portion 1b of the acceleration sensor chip 1 to be displaced. The recess of the island portion 10 can be formed by press working or the like. Alternatively, the acceleration sensor chip 1 may be bonded to the island portion 10 through a joining material including filler with a specific diameter to enable the weight portion 1b to be displaced.

The acceleration sensor chip 1 may be formed from the silicon single crystal substrate using a well-known surface micro-machine processing technique in place of the electrochemical etching technique. Although the present invention is applied to the acceleration sensor chip 1 utilizing the piezoresistance effect in the first embodiment, it is not limited only to the acceleration sensor chip 1. For example, a capacity type acceleration sensor chip can be also adopted for the present invention. The capacity type acceleration sensor chip usually has a movable electrode that is displaced in accordance with acceleration and a fixed electrode that is not displaced, and utilizes a change in capacity between the movable electrode and the fixed electrode to detect the acceleration. Further, it is not always necessary that the molded package 6 has the molded side face 100 contacting the mounting surface of the circuit board 4. In such a case, the molded package 6 is disposed on the circuit board 4 through the first and second leads 7 and 8.

(Second Embodiment)

The parts and components similar to those in the first embodiment will be shown with the same reference numerals and detail descriptions thereof will not be reiterated in the following embodiments.

Figure 6:
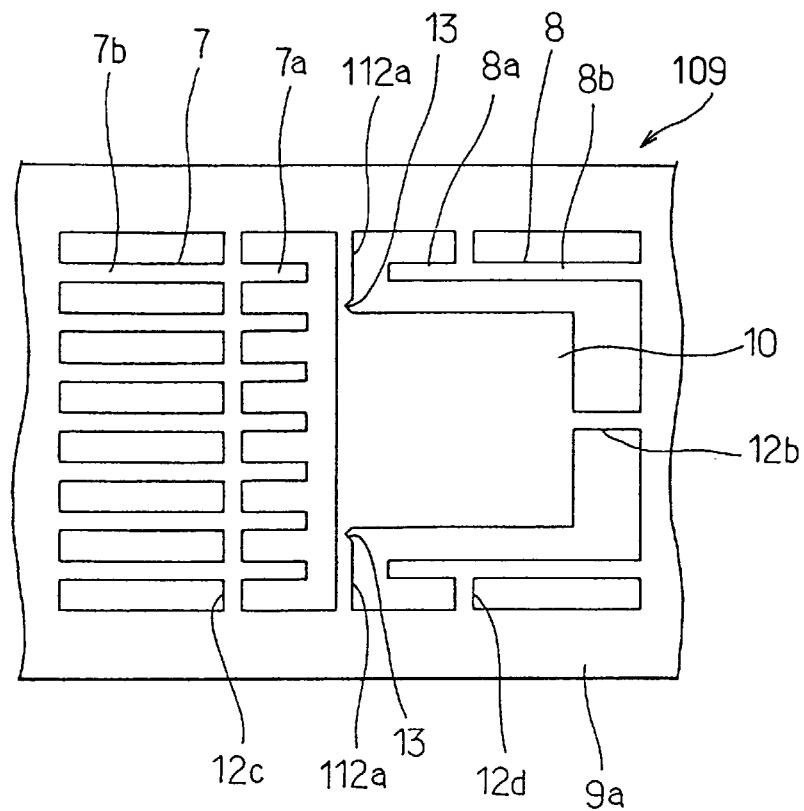
FIG. 6 is a plan view showing a lead frame in a second embodiment.

A second preferred embodiment is most characterized in that, as shown in FIG. 6, a lead frame 109 has two tie-bars 112a that are to be distorted in the bending process for bending up the island portion 10 as well, and the tie-bars 112a respectively have notch portions 13. Each of the notch portions 13 is formed so that bending stress generated during the bending process is locally concentrated on the notch portions 13. In the second embodiment, as shown in FIG. 6, the notch portions 13 are formed on base portions of the tie-bars 112a protruding from the island portion 10.

The notch portions 13 reduce amounts of spring-back of the tie-bars 112a accompanying the bending process for bending the island portion 10. Accordingly, bending accuracy of the island portion 10 is improved, resulting in improvement of detecting reliability of the acceleration sensor chip 1. In addition to the notch portions 13, the other structures such as through holes can be employed as the structure for locally concentrating the bending stress generated during the bending process. The other features and effects are the same as those in the first embodiment.

(Third Embodiment)

Figure 7:
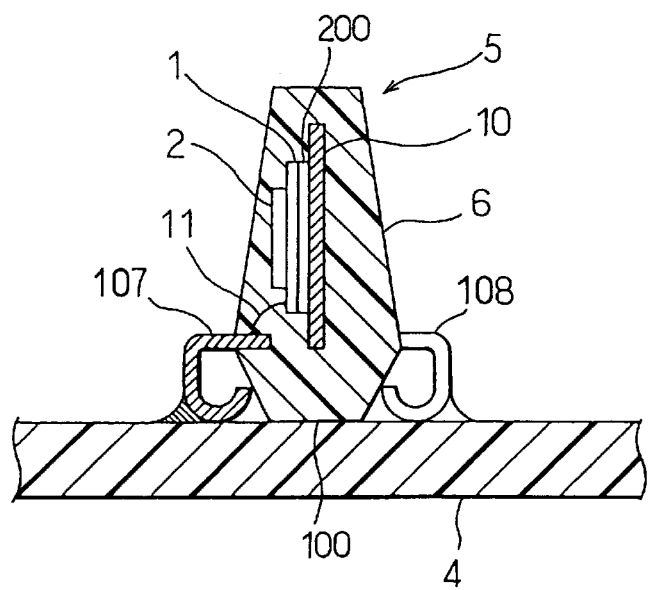
FIG. 7 is a cross-sectional view showing an acceleration sensor device in a third embodiment.

In the first embodiment, the first and second leads 7 and 8 respectively have the Gullwing shape. As opposed to this, in a third preferred embodiment, the acceleration sensor device 5 has first and second leads 107 and 108 shown in FIG. 7, each of which has a J-like shape similar to that of a lead for an SOJ (Small Out-line J-leaded package). The other features and effects are the same as those in the first embodiment.

(Fourth Embodiment)

Figure 8:
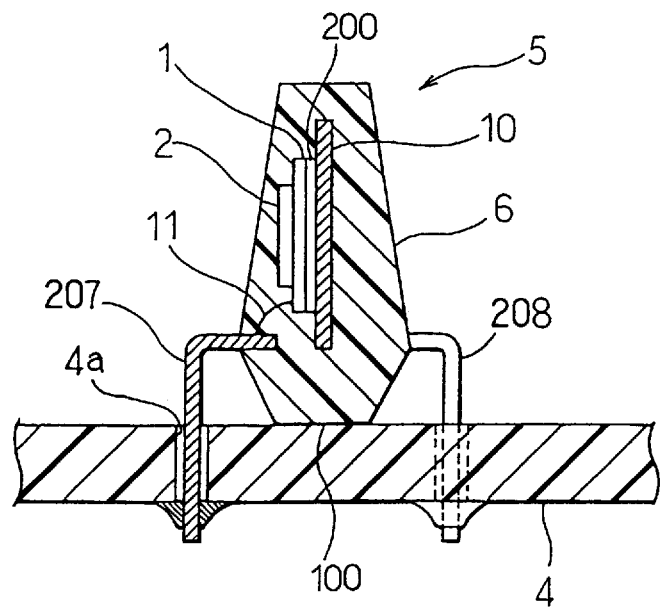
FIG. 8 is a cross-sectional view showing an acceleration sensor device in a fourth embodiment.

In a fourth preferred embodiment, as shown in FIG. 8, the acceleration sensor device 5 has first and second leads 207 and 208, each of which has an in-line shape similar to that of a lead for a DIP (Dual In-line package). In this case, the acceleration sensor device 5 is mounted on the circuit board 4 by inserting the first and second leads 207 and 208 into through holes 4a formed in the circuit board 4. The other features and effects are the same as those in the first embodiment.

(Fifth Embodiment)

Figure 9:
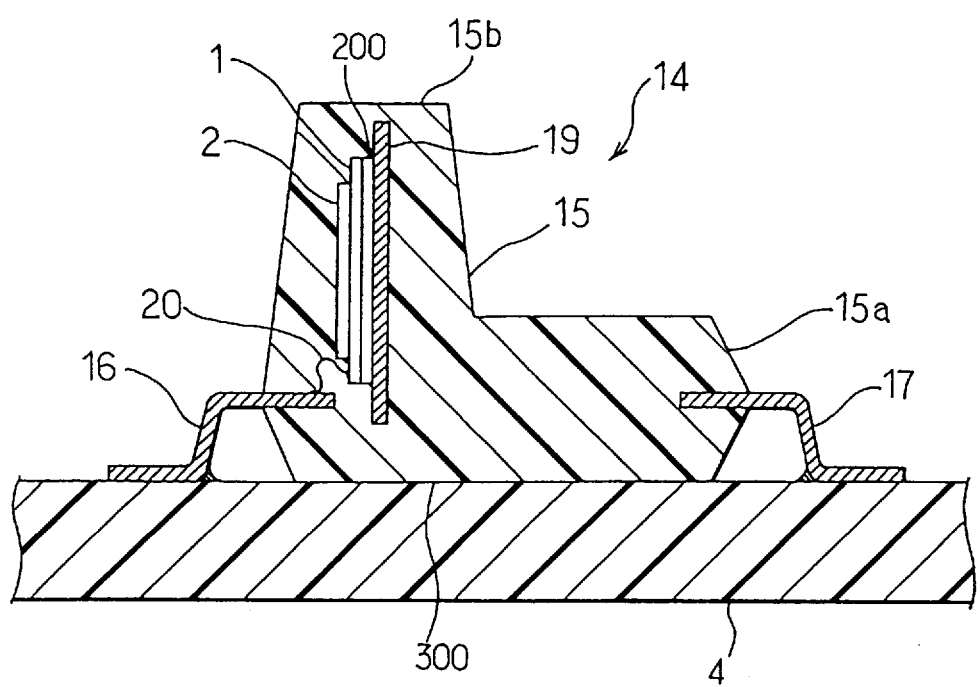
FIG. 9 is a cross-sectional view showing an acceleration sensor device in a fifth embodiment.

In a fifth preferred embodiment, as shown in FIG. 9, an acceleration sensor device 14 has a resin molded package 15 and first and second leads 16 and 17 protruding on both sides from the molded package 15. In the fifth embodiment, each number of the first and second leads 16 and 17 is four, and each of the first and second leads 16 and 17 has the Gullwing shape, and is bonded to the circuit board 4 through solder (not shown), so that the acceleration sensor device 14 is mounted on the circuit board 4.

The molded package 15 has a base portion 15a directly disposed on the circuit board 4 through a molded side face thereof and a perpendicular portion 15b protruding from the base portion 15a in a direction substantially perpendicular to the mounting surface of the circuit board 4. That is, the molded package 15 has generally an L-shape in cross-section. Further, an island portion 19 of a lead frame 18 (see FIG. 10) is disposed in the perpendicular portion 15b of the molded package 15 to have a chip mounting surface thereof perpendicular to the mounting surface of the circuit board 4. As in the first embodiment, the acceleration sensor chip 1 is mounted on the island portion 19 by die-bonding so that the detection axis of the acceleration sensor chip 1 is parallel to the mounting surface of the circuit board 4. The acceleration sensor chip 1 is electrically connected to the first leads 16 through bonding wires 20.

Figure 10:
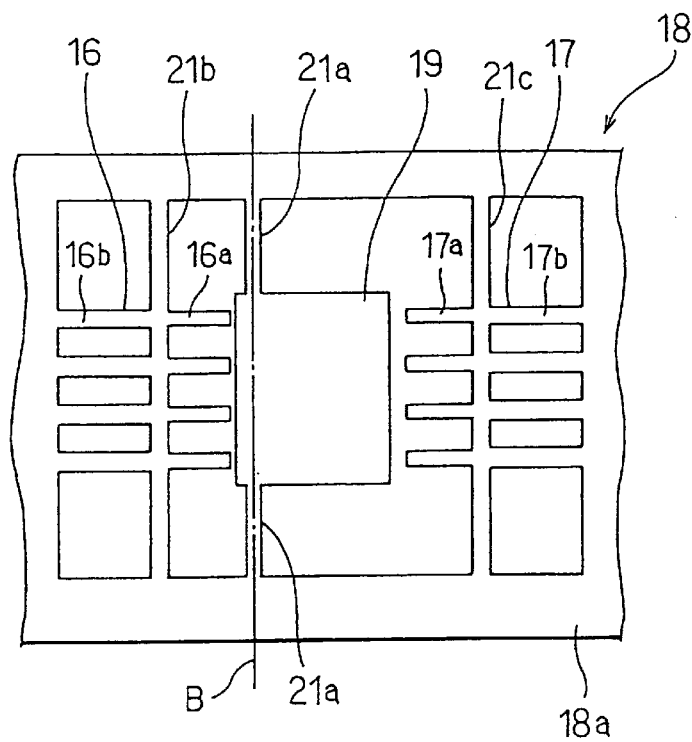
FIG. 10 is a plan view showing a lead frame in the fifth embodiment.

The above-mentioned lead frame 18 is, as shown in FIG. 10, constructed to have a frame 18a and the above-mentioned island portion 19 having a rectangular shape and supported by the frame 18a through a pair of tie-bars 21a. The tie-bars 21a are disposed on a dashed line B in FIG. 10 to protrude in directions opposite to each other from both sides of the island portion 19 at positions adjacent to another side of the island portion 19 parallel to the dashed line B.

The first leads 16 are respectively composed of inner leads 16a and outer leads 16b. Each of the first leads 16 is connected to the frame 18a on a front end side thereof, i.e., on an outer lead side thereof, while facing the side of the island portion 19 adjacent to the tie-bars 21a on a base end thereof, i.e., on an inner lead side thereof. The first leads 16 are further supported by the frame 18a through several tie-bars 21b. Likewise, the second leads 17 are respectively composed of inner leads 17a and outer leads 17b. Each of the second leads 17 is connected to the frame 18a on a front end side thereof, i.e., on an outer lead side thereof, while facing the other side of the island portion 19 on an opposite side of the first leads 17 with respect to the island portion 19, on a base end side thereof, i.e., on an inner lead side thereof. The second leads 18 are further connected to the frame 18a through several tie-bars 21c.

Figure 11A:
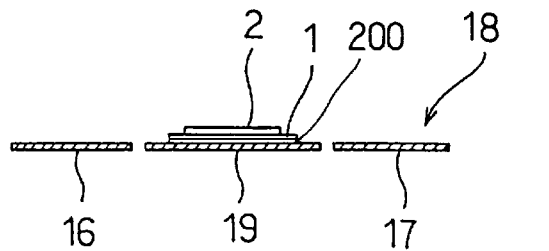
FIGS. 11A to 11E are cross-sectional views for explaining process of forming the acceleration sensor device in the fifth embodiment.
Figure 11B:
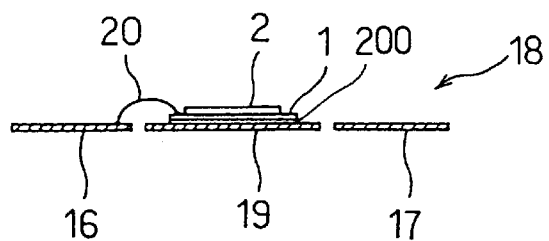

Next, processes for forming the acceleration sensor device 14 using the lead frame 18 will be explained with reference to FIGS. 11A to 11E. The die bonding process shown in FIG. 11A and the wire bonding process shown in FIG. 11B are substantially the same as those in the first embodiment shown in FIGS. 5A and 5B, and therefore detail descriptions thereof will be omitted. Here, it should be noted that in this embodiment, the bonding pads provided on the acceleration sensor chip 1 for the bonding wires 20 are provided at positions slightly shifted inside of the island portion 19 from the dashed line B (see FIG. 10) connecting the tie-bars 21a, in a state where the acceleration sensor chip 1 is mounted on the island portion 19.

Figure 11C:
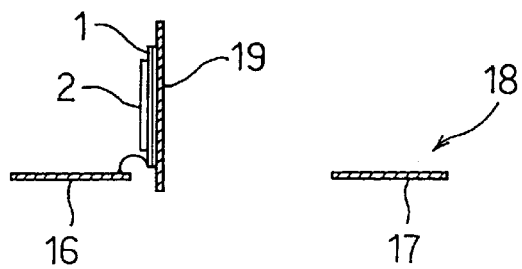

Then, as shown in FIG. 11C, in a bending process, the island portion 19 is bent up along the dashed line B so that the chip mounting surface of the island portion 19 is perpendicular to the mounting surface of the circuit board 4. In this process, the tie-bars 21a are distorted to allow the island portion 19 to have the above-mentioned state. Because the bonding pads are provided at the positions slightly shifted inside of the island portion 19 from the dashed line B, the bonding pads are displaced to come close to the inner leads 16a by the bending process. Therefore, no tension is applied to the bonding wires 20 during the bending process.

Figure 11D:
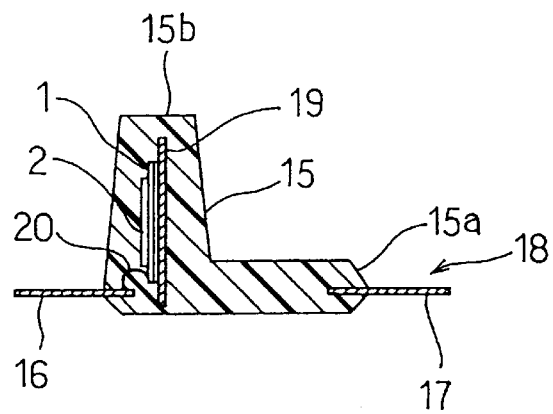
Figure 11E:
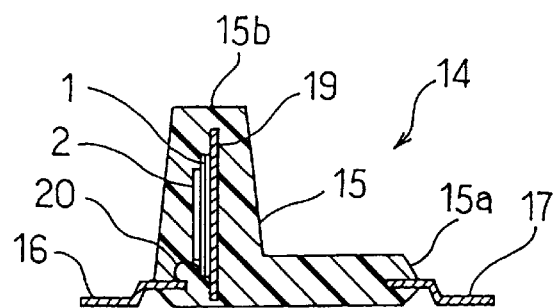

Subsequently, as shown in FIG. 11D, a molding process for forming the molded package 15 composed of the base portion 15a and the perpendicular portion 15b is performed. If necessary, a deburring process may be performed after the molding process. Then, as shown in FIG. 11E, a lead forming process is performed. Specifically, the tie-bars 21a, 21b, and 21c (see FIG. 10) are cut and removed together with the frame 18a, and thereafter, the outer leads 16a and 17a are bent to respectively have the Gullwing shapes. As a result, the first and second leads 16 and 17 are obtained. Then, a marking process with respect to the molded package 15, an inspection process with respect to the sensor chip 1, and the like are performed. Consequently, the acceleration sensor device 14 is completed.

In the fifth embodiment, the same effects as in the first embodiment are obtained as well. In addition, according to the fifth embodiment, the molded package 15 provides an extra space on the base portion 15a. Therefore, electronic parts such as a capacitor chip, a resistor chip, and the like necessary for processing output signals from the acceleration sensor device 14 can be disposed in the space. As a result, an integrated density is increased.

(Sixth Embodiment)

Figure 12:
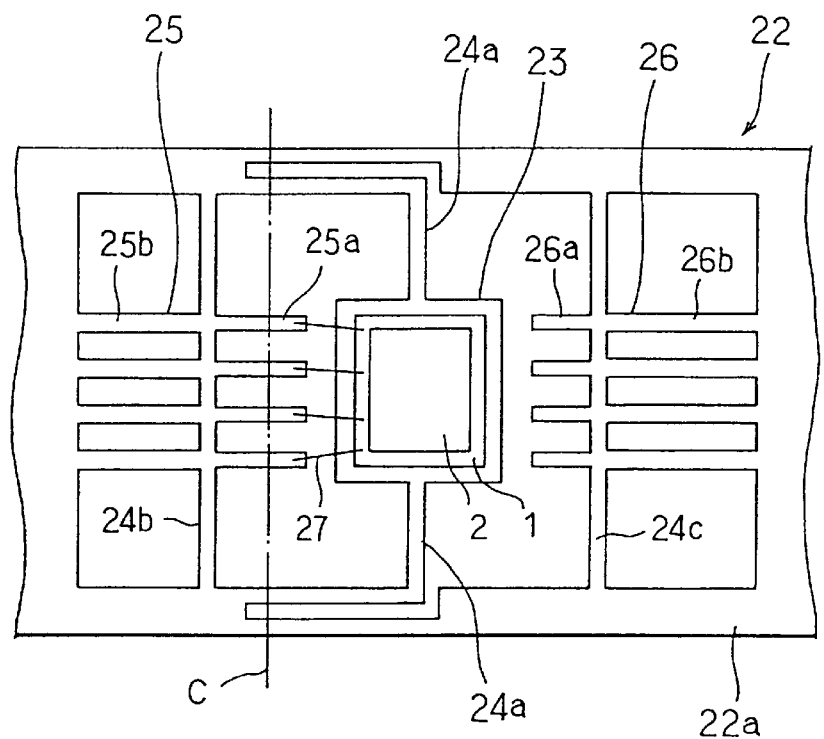
FIG. 12 is a plan view showing a lead frame in a sixth embodiment.

In a sixth preferred embodiment, a lead frame 22 shown in FIG. 12 is used for forming an acceleration sensor device. In the lead frame 22, an island portion 23 having a rectangular shape is supported by a frame 22a through a pair of tie-bars 24a, which are disposed on both sides of the island portion 23 parallel to each other, approximately at central positions of the sides of the island portion 23. The tie-bars 24a respectively have L-shapes, which elongate from the sides of the island portion 23 in directions opposite to each other toward the frame 22a, and then are bent perpendicularly to elongated toward a dashed line C shown in FIG. 12 in parallel with the sides of the island portion 23. The dashed line C indicates a bent portion that is to be bent in a bending process (described later).

Several wires of first leads 25 are composed of inner leads 25a and outer leads 25b. Each of the first leads 25 is directly connected to the frame 22a on a front end side thereof, i.e., on an outer lead side thereof, while facing the island portion 23 on a base end thereof, i.e., on an inner lead side thereof. Especially, it should be noted that the inner leads 25a cross the dashed line C perpendicularly approximately at central portions thereof. The first leads 25 are further supported by the frame 22a through tie-bars 24b. Likewise, several wires of second leads 26 are composed of inner leads 26a and outer leads 26b. Each of the second leads 26 is directly connected to the frame 22a on a front end side thereof, i.e., on an outer lead side thereof, while facing the island portion 23 on an opposite side of the first leads 25, on a base end side thereof, i.e., on an inner lead side thereof. The second leads 26 are further supported by the frame 22a through tie-bars 24c.

When the acceleration sensor device is formed using the thus designed lead frame 22, as in the above-mentioned embodiments, the die-bonding process for mounting the acceleration sensor chip 1 combined with the protection cap 2 and the base 200 on the island portion 23, and the wire bonding process for connecting the bonding pads disposed on the acceleration sensor chip 1 and the inner leads 25a of the first leads 25 through bonding wires 27 are performed. Then, in a bending process, the tie-bars 24a and the inner leads 25a of the first leads 25 are bent up along the dashed line C so that the chip mounting surface of the island 25 becomes perpendicular to the mounting surface of the circuit board 4. The other features and effects are the same as those in the first embodiment.

(Seventh Embodiment)

Figure 13:
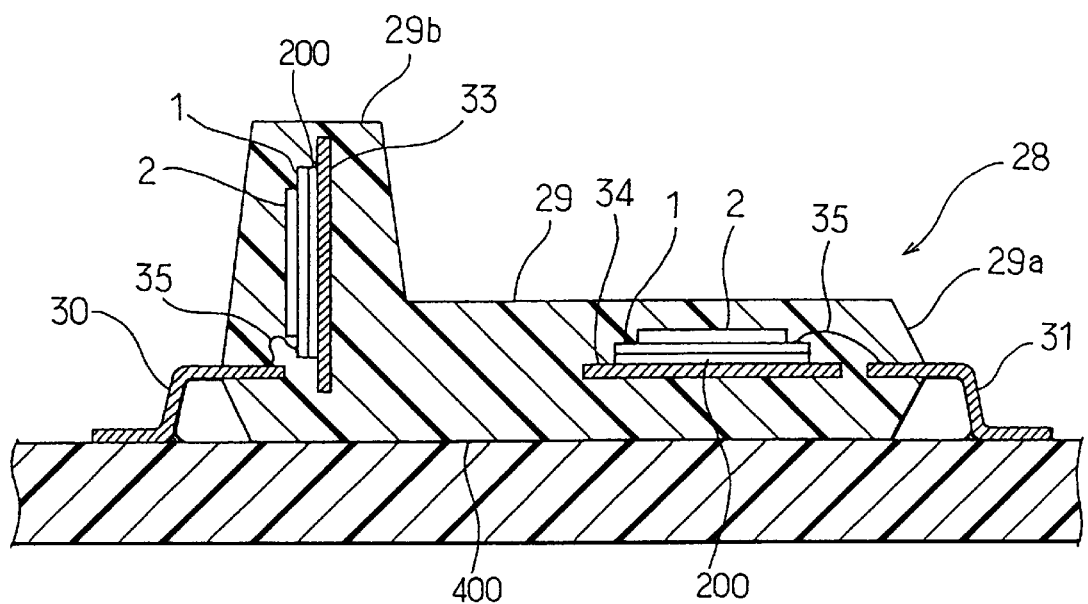
FIG. 13 is a cross-sectional view showing an acceleration sensor device in a seventh embodiment.
Figure 14:
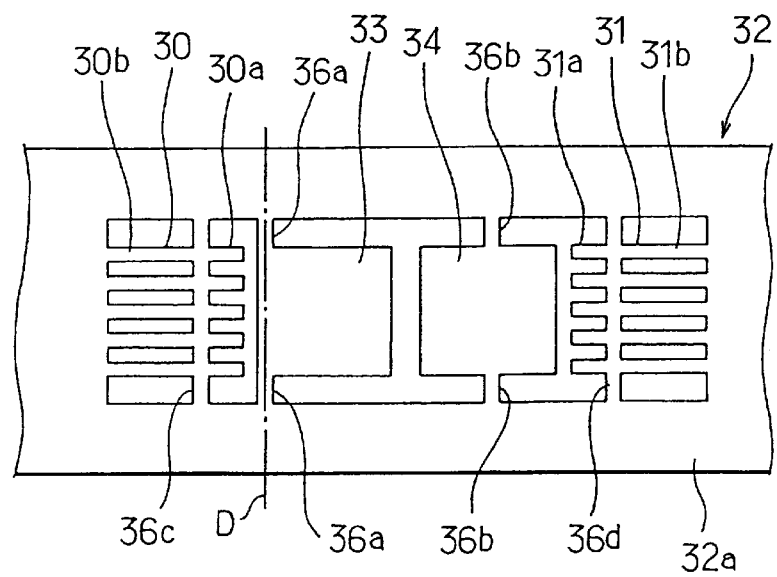
FIG. 14 is a plan view showing a lead frame in the seventh embodiment.

An acceleration sensor device 28 and a lead frame 32 used for forming the acceleration sensor device 28 in a seventh preferred embodiment are shown in FIGS. 13 and 14, respectively. The acceleration sensor device 28 has a resin molded package 29 and first and second leads 30 and 31 protruding from the molded package 29, and is mounted on the circuit board 4 with the first and second leads 30 and 31 bonded to the circuit board 4. In this embodiment, each number of the first and second leads 30 and 31 is five, and each of the first and second leads 30 and 31 has a Gullwing shape.

The molded package 29 is made of resin such as epoxy resin, silicone resin, hybrid resin of the epoxy and silicone resins, or the like, and has an generally L shape in cross section. Specifically, the molded package 29 is composed of a base portion 29a that is to be disposed on the circuit board 4 through a molded side face 400 thereof and a perpendicular portion 29b protruding from the base portion 29a generally perpendicularly to the circuit board 4. The perpendicular portion 29b retains therein a first island portion 33 of the lead frame 32 (described later) in a state where the chip mounting surface of the first island portion 33 is perpendicular to the mounting surface of the circuit board 4. The first island portion 33 holds the acceleration sensor chip 1 integrally combined with the protection cap 2 and the base 200 on the chip mounting surface thereof. The base portions 29a of the molded package 29 retains therein a second island 34 of the lead frame 32 in a state where the chip mounting surface of the second island 34 is parallel to the mounting surface of the circuit board 4. The second island 34 also holds another acceleration sensor chip 1 integrally combined with the protection cap 2 and the base 200.

That is, the acceleration sensor device 28 has the first and second island portions 33 and 34 with the chip mounting surfaces which are perpendicular to each other, and the first and second island portions 33 and 34 respectively hold the acceleration sensor chips 1, each of which has an acceleration detection axis perpendicular to a surface thereof, on the mounting surfaces thereof. One acceleration sensor chip 1 disposed on the first island portion 33 is connected to the first leads 30 and the other acceleration sensor chip 1 disposed on the second island portion 34 is connected to the second leads 31.

The lead frame 32 used for forming the above-mentioned acceleration sensor device 28 has the following construction. That is, as shown in FIG. 14, in the lead frame 32, the first and second island portions 33 and 34 having rectangular shapes are disposed to make a specific gap therebetween. The first island portion 33 is supported by a frame 32a through a pair of first tie-bars 36a. The first tie-bars 36a are provided on both ends of a side of the first island portion 33

(on an opposite side of the second island portion 34) on a dashed line D shown in FIG. 14, which is parallel to the side of the first island portion 33, to protrude in directions opposite to each other. On the other hand, the second island portion 34 is supported by the frame 32a through a pair of second tie-bars 36b. The second tie-bars 36b are provided approximately at central portions of both sides of the second island portion 34 to protrude in parallel with the first tie-bars 36a. The second island portion 34 can be supported by the frame 32a through another pair of tie-bars in addition to the second tie-bars 36b to be supported by the frame 32a at four points.

Structures of the first and second leads 30 and 31 are substantially the same as those in the fifth and sixth embodiments, and detail explanations will not be reiterated. In this embodiment, reference numerals 30a, 30b, 31a, and 31b respectively indicate inner and outer leads of the first leads 30 and inner and outer leads of the second leads 31. Further, reference numerals 36c and 36d indicate tie-bars respectively connecting the first and second leads 30 and 31 to the frame 32a. The inner leads 30a of the first leads 30 face the side of the first island portion 33 having the first tie-bars 36a on the opposite side of the second island portion 34. The inner leads 31a of the second leads 31 face the second island portion 34 on the opposite side of the first island portion 33.

When the acceleration sensor device 28 is formed using the thus designed lead frame 32, first, the die bonding process for bonding the acceleration sensor chips 1 to the first and second island portions 33 and 34 and the wire bonding process for connecting the bonding pads of the acceleration sensor chips 1 to the first and second leads 30 and 31 through bonding wires 35 are performed. Next, in the bending process, the first island portion 33 is bent up along the dashed line D connecting the tie-bars 36a, so that the chip mounting surface of the first island portion 33 becomes perpendicular to the mounting surface of the circuit board 4.

After performing the bending process, the molded package 29 composed of the base portion 29a and the perpendicular portion 29b is formed in a molding process such that the perpendicular portion 29b holds the first island portion 33 therein and the base portion 29a holds the second island portion 34 therein. Then, the lead forming process, the marking process, the inspection process, and the like, which are substantially the same as those in the above-mentioned embodiments, are performed. As a result, the acceleration sensor device 28 is obtained.

The seventh embodiment also exhibits the same effects as in the first embodiment. Further, as in the fifth embodiment, the molded package 29 provides an extra space on the base portion 29a thereof. Therefore, electronic parts necessary for processing output signals from the acceleration sensor device 28 can be disposed in the space, resulting in improvement of an integrated density. Furthermore, according to the seventh embodiment, the acceleration sensor device 28 includes two acceleration sensor chips 1 respectively having acceleration detection axes perpendicular to each other. Therefore, the acceleration sensor device 28 detects accelerations in directions perpendicular and parallel to the mounting surface of the circuit board 4. Further, the acceleration sensor device 28 is formed using the lead frame 32 by bending only one of the first and second island portions 33 and 34, resulting in sufficient manufacturing performance. In the seventh embodiment, only the first island portion 33 is bent. In the seventh embodiment, two acceleration sensor chips 1 are mounted on the first and second island portions 33 and 34 of the lead frame 32. However, only one of the first and second island portions 33 and 34 may hold one acceleration sensor chip 1 thereon, while the other may hold another type of an IC chip.

(Eighth Embodiment)

In a eighth preferred embodiment, a lead frame 37 shown in FIG. 15 is utilized to form an acceleration sensor device. The lead frame 37 has first, second, and third island portions 38, 39, and 40 respectively having rectangular shapes. The second and third island portions 39 and 40 are arranged to face each other in a vertical direction in FIG. 15 with a specific gap. The first island portion 38 is arranged to face gap between the second and third island portions 39 and 40 in a horizontal direction in FIG. 15.

The first island portion 38 is supported by a frame 37a through a pair of first tie-bars 41a, which are disposed on both ends of a side of the first island portion 38 on an opposite side of the second and third island portions 39 and 40. More specifically, the first tie-bars 41a elongate from the first island portion 38 to the frame 37a in directions opposite to each other on a dashed line E shown in FIG. 15 that is parallel to the side of the first island portion 38. The second island portion 39 is supported by the frame 37a through a pair of second tie-bars 41b, which are disposed at portions close to both ends of a side of the second island portion 39 on an opposite side of the third island portion 40. More specifically, the second tie-bars 41b elongate from the second island portion 39 in directions opposite to each other on a dashed line F perpendicular to the dashed line E. That is, the second tie-bars 41b are perpendicular to the first tie-bars 41a. The third island portion 40 is supported by the frame 37a through a pair of third tie-bars 41c, which are disposed approximately at central portions of both sides of the third island portion 40 to protrude in parallel with the second tie-bars 41b in directions opposite to each other.

The lead frame 37 further has first, second, and third leads 42, 43, and 44, respectively composed of inner leads 42a, 43a, and 44a, and outer leads 42b, 43b, and 44b. Each of the first leads 42 is connected to the frame 72a on a front end side thereof, i.e., on an outer lead side thereof, while facing the side of the first island portion 38 having the first tie-bars 41a on a base end side thereof, i.e., on an inner lead side thereof. The first leads 42 are further supported by the frame 37a through tie-bars 41d. Each of the second leads 43 is connected to the frame 37a on a front end side thereof, i.e., on an outer lead side thereof, while facing the second island portion 39 on an opposite side of the third island portion 40 and on an inner lead side thereof. The second leads 43 are further supported by the frame 37a through tie-bars 41e. Further, each of the third leads 44 is connected to the frame 37a on a front end side thereof, i.e., on an outer lead side thereof, while facing the third island portion 40 on an opposite side of the second island portion 39 and on an inner lead side thereof. The third leads 44 are further supported by the frame 37a through tie-bars 41f.

When the acceleration sensor device is formed using the thus designed lead frame 37, first, acceleration sensor chips 1, each of which is combined with the protection cap 2 and the base 200, are respectively attached to the first, second, and third island portions 38, 39. and 40 by the die bonding process. Then, the wire bonding process is performed such that the bonding pads provided on the acceleration sensor chips 1 are respectively connected to the inner leads 42a, 43a, and 44a through bonding wires 45. The state of the lead frame 37 and the acceleration sensor chips 1 after performing the wire bonding process is shown in FIG. 16.

Next, in the bending process, by twisting the first and second tie-bars 41a and 41b, the first and second island portions 38 and 39 are bent up respectively around the dashed lines E and F. Accordingly, the chip mounting surfaces of the first and second island portions 38 and 39 become perpendicular to the mounting surface of the circuit board 4 (not shown). Further, it should be noted that the chip mounting surfaces of the first and second island portions 38 and 39 are perpendicular to each other. As the third island portion 40 is not displaced in the bending process, the third island portion 40 is parallel to the mounting surface of the circuit board 4 and perpendicular to the chip mounting surfaces of the first and second island portions 38 and 39 respectively. After performing the bending process, the molding process for forming the molded package, the lead forming process, the marking process, the inspection process, and the like are performed as in the above-mentioned embodiments, so that the acceleration sensor device is completed.

According to the eighth embodiment, the same effects as in the first embodiment are obtained. In addition, in the eighth embodiment, the acceleration sensor device formed by using the lead frame 37 is a three-dimensional type. That is, the acceleration sensor device includes three acceleration sensor chips with three acceleration detection axes perpendicular to each other to detect accelerations in three dimensional direction. Further, to produce the three-dimensional type acceleration sensor device, only two (the first and second island portions 38 and 39) of the island portions 38, 39, and 40 are bent up in the bending process, resulting in sufficient manufacturing performance.

While the present invention has been shown and described with reference to the foregoing preferred embodiments, it will be apparent to those skilled in the art that changes in form and detail may be made therein without departing from the scope of the invention as defined in the appended claims.

For example, the lead frame 32 (see FIG. 14) in the seventh embodiment may have an auxiliary tie-bar for connecting the first and second island portions 33 and 34 so that the first and second island portions 33 and 34 are respectively supported at three portions. Accordingly, even in a case where an external force is applied to the first and second island portions 33 and 34 during the die-bonding process and the wire bonding process, the island portions 33 and 34 are held at initial positions thereof. Consequently, reliability of the acceleration sensor device is improved. In this case, it is apparent that the cutting process for cutting the auxiliary tie-bar is performed before the bending process.

The lead frame 37 (see FIG. 15) in the eighth embodiment may have auxiliary tie-bars for connecting the first island portion 38 and the frame 37a, and the second island portion 39 and the third island portion 40. In this case, the first, second, and third island portions 38, 39, and 40 are respectively supported by the frame 37a at three portions, resulting in improvement of the reliability of the acceleration sensor device as well.

The feature of the second embodiment for locally concentrating bending stress generated in the bending process on specific portions by adopting the notch portions 13 to the lead frame 19 can be applied to the other lead frames of the other embodiments. In the above-mentioned embodiments, one, two, or three island portions are provided in the corresponding lead frame; however, more than four island portions may be provided in a lead frame to be allowed to have chip mounting surfaces thereof perpendicular to each other by the bending process or the like. Then, transducer chips having physical quantity detection axes respectively perpendicular to surfaces thereof may be respectively attached to the island portions. In this case, by appropriately setting bending angles of the island portions, a multidimensional type sensor apparatus having several detection axes for detecting a physical quantity can be easily realized.

The present invention is applied not only to the acceleration sensor device but also to other sensor devices including transducer chips mounted on island portions of lead frames. It is apparent that the present invention can be applied to sensor devices including transducer chips with detection axes perpendicular to surfaces of the chip, such as a photo-sensor chip, a magnetometric sensor chip, and the like. When the photo-sensor chip is used, it is necessary that a molded package is made of transparent material.

In the above-mentioned embodiments, the packages are molded from resin; however, it is possible to use a ceramic package with a cavity. In this case, the island portion of the lead frame holding the transducer chip is disposed within the cavity in a state where the chip mounting surface of the island portion is perpendicular to the mounting surface of the circuit board, and the cavity is sealed with a cap member.

Variations such as those described above are to be understood as being within the scope of the present invention as defined by the appended claims.

What is claimed is:

1. A sensor device comprising:
    a circuit board;
    a package disposed on the circuit board;
    at least one island portion retained in the package and having a chip mounting surface arranged at a predetermined angle to the circuit board, wherein positioning the chip mounting surface at said predetermined angle is achieved by partially deforming a lead frame;
    a transducer chip for detecting a physical quantity, the transducer chip being held on the chip mounting surface; and
    a lead connecting the transducer chip and the circuit board.

2. The sensor device of claim 1, wherein the angle between the chip mounting surface of the at least one island portion and the circuit board is a right angle.

3. The sensor device of claim 2, wherein the transducer chip detects the physical quantity in a direction perpendicular to a main surface of the transducer chip.

4. The sensor device of claim 1, wherein the at least one island portion comprises first and second island portions retained in the package and having first and second mounting surfaces, respectively, which are non-parallel to each other.

5. The sensor device of claim 4, wherein one of the first and second chip mounting surfaces is perpendicular to the circuit board, and the other of the first and second chip mounting surfaces is parallel to the circuit board.

6. The sensor device of claim 4, wherein the first and second island portions respectively hold first and second transducer chips having physical quantity detection axes perpendicular to main surfaces thereof.

7. The sensor device of claim 1, wherein the at least one island portion comprises first, second, and third island portions retained in the package and respectively having first, second, and third chip mounting surfaces perpendicular to each other.

8. A sensor device manufactured by:
    preparing a lead frame comprising a frame portion, an island portion supported by the frame portion, and a lead extending from the lead frame towards the island portion;

attaching a transducer chip to a chip mounting surface of the island portion;

electrically connecting the transducer chip and the lead;

partially deforming the lead frame to arrange the chip-mounting surface of the island portion at a predetermined angle to the frame portion;

integrally molding the transducer chip, the island portion, and a portion of the lead into a package so that the lead has a first portion protruding from the package and a second portion extending in the package in a direction non-parallel to the chip mounting surface; and disposing the package on a circuit board to arrange the chip mounting surface of the island portion at the predetermined angle relative to the circuit board.

9. The sensor device of claim 8, wherein the angle between the chip mounting surface of the island portion and the circuit board is a right angle.

10. The sensor device of claim 8, wherein the lead and the island portion are separated from the frame portion before disposing the package on the circuit board.

11. A method of producing a sensor device, comprising:

preparing a lead frame having a frame portion, at least one island portion supported by the frame portion, and at least one lead connected to the frame portion;

attaching a transducer chip to a chip mounting surface of the at least one island portion;

electrically connecting the transducer chip and the at least one lead using a wire;

partially deforming the lead frame to arrange the chip mounting surface of the at least one island portion at a predetermined angle to the frame portion; and disposing the at least one island portion together with the transducer chip on a circuit board to arrange the chip mounting surface at the predetermined angle relative to the circuit board.

12. The method of claim 11, wherein a pair of first tie-bars connects the at least one island portion to the frame portion, the first tie-bars being distorted while partially deforming the lead frame.

13. The method of claim 12, wherein one of the first tie-bars has a notch portion.

14. The method of claim 12, wherein the first tie-bars extend from the at least one island portion to the frame portion in directions opposite to each other.

15. The method of claim 12, wherein a second tie-bar connects the at least one island portion to the frame portion, the second tie-bar being cut before partially deforming the lead frame.

16. The method of claim 11, further comprising bending the at least one lead while partially deforming the lead frame.

17. The method of claim 11, wherein a distance between the position of where a first end of the wire connects to the transducer chip and a position of where a second end of the wire connects to the at least one lead decreases by partially deforming the lead frame.

18. The method of claim 11, wherein the angle between the chip mounting surface and the circuit board is a right angle.

19. The method of claim 11, where the at least one island portion and the at least one lead are separated from the frame portion before disposing the at least one island portion on the circuit board.

20. The method of claim 11, wherein the at least one lead comprises first and second leads disposed on both sides of the at least one island portion after partially deforming the lead frame, the first lead having a front end connected to a side of the frame portion and a base end for being connected to the transducer chip through the wire, the second lead having a front end connected to an opposite side of the frame portion with respect to the first lead and a base end facing the first lead.

21. The method of claim 20, further comprising:

before disposing the at least one island portion on the circuit board, molding the at least one island portion holding the transducer chip and the base ends of the first and second leads into a package member, the package member having the front ends of the first and second leads respectively protruding from the package member on both sides of the package member, wherein disposing the at least one island portion on the circuit board includes disposing the package member on the circuit board and bonding the front ends of the first and second leads to the circuit board.

22. The method of claim 20, wherein the lead frame further has a pair of first tie-bars respectively extending from corner portions of the at least one island portion on a first lead si de to the frame portion.

23. The method of claim 22, wherein the first tie-bars are distorted while partially deforming the lead frame.

24. The method of claim 22, wherein the lead frame further has an auxiliary tie-bar connecting the at least one island portion and the frame portion.

25. The method of claim 11, wherein the at least one lead comprises first and second leads respectively connected to opposite sides of the frame portion, and the at least one island portion comprising first and second island portions each having first and second chip mounting surfaces respecitively and disposed between the first and second leads and each supported by the frame portion through a first pair of tie-bars and a second pair of tie-bars, respectively.

26. The method of claim 25, wherein:

the first tie-bars extend from the first island portion to the frame portion; and the second tie-bars extend from the second another island portion to the frame portion.

27. The method of claim 26, wherein the first tie-bars are distorted while partially deforming the lead frame such that the first chip mounting surface of the first island portion becomes non-parallel to the second chip mounting surface of the second island portion.

28. The method of claim 25, wherein the lead frame has an auxiliary tie-bar connecting the first and second island portions.

29. A method of producing a sensor device, comprising:

preparing a lead frame comprising a frame portion and first, second, and third island portions each supported by pairs of first, second, and third tie-bars, the lead frame have first, second, and third leads extending therefrom towards the first, second, and third island portions, respectively;

attaching a transducer chip to a respective chip mounting surface of each of the first, second and third island portions;

electrically connecting the transducer chip and the leads;

partially deforming the lead frame to arrange the chip mounting surface of the first, second and third island portions at respective predetermined angles to the frame portion; and disposing the first, second and third island portions together with the transducer chip on a circuit board to arrange the respective chip mounting surfaces at the respective predetermined angles relative to the circuit board.

30. The method of claim 29, wherein by partially deforming the lead frame, the first, second, and third island portions respectively have first, second, and third chip mounting surfaces thereof non-parallel to each other.

31. The method of claim 29, wherein partially deforming the lead frame, two of the first, second, and third tie-bars are distorted such that the first, second, and third chip mounting surfaces of the first, second, and third island portions becomes perpendicular to each other.

32. The method of claim 29, wherein the first, second, and third island portions each respectively hold transducer chips thereon, the transducer chips each having a physical quantity detection axes perpendicular to main surfaces of the transducer chips.

33. The method of claim 29, wherein the lead frame further has an auxiliary tie-bar connecting the first and second island portions.

34. A method of producing a sensor device, comprising:

preparing a lead frame having a frame portion, an island portion with a chip mounting surface supported by the frame portion by a tie-bar, and a lead extending from the frame portion towards the island portion;

partially deforming the lead frame along a specific line to arrange the chip mounting surface at a predetermined angle to the lead frame, the specific line being approximately parallel to the tie-bar;

separating the island portion and the lead from the frame portion to preserve the predetermined angle between the chip mounting surface of the island portion and the lead frame; and disposing the island portion on a circuit board to arrange the chip mounting surface at the predetermined angle relative to the circuit board.

35. The method of claim 34, further comprising:

before partially deforming the lead frame, attaching a transducer chip to the chip mounting surface of the island portion; and electrically connecting the transducer chip and the lead, wherein the transducer chip is disposed on the circuit board together with the island portion to make the predetermined angle with the circuit board.

36. The method of claim 35, wherein the angle between the transducer chip and the circuit board is a right angle.

37. The sensor device of claim 1, further comprising a support member protruding from the package and fixed to the circuit board.

38. The sensor device of claim 37, the support member being separate from the transducer chip in the package.

39. The sensor device manufactured by the process of claim 8, the process further comprising:

partially molding into the package a supporting member connecting the frame portion to the lead, the supporting member being partially molded into the package together with the transducer chip, the island portion, and an end portion of the lead.

40. The sensor device manufactured by the process of claim 8, wherein preparing the lead frame includes preparing the lead frame having a tie-bar extending in a direction approximately perpendicular to the lead and connecting the island portion to the frame portion.

41. The sensor device of claim 8, including:

bonding a wire to the transducer chip for electrically connecting the transducer chip and the lead; and wherein partially deforming the lead frame includes partially deforming the lead frame along a line extending between the bonding position of the transducer chip and the lead.

42. The method of claim 11, further comprising:

before disposing the island portion on the circuit board, integrally molding the transducer chip, the at least one island portion, and the at least one lead into a package so that the at least one lead has a first portion protruding from the package and a second portion extending in the package in a direction non-parallel to the chip mounting surface.

43. The method of claim 42, wherein:

the lead frame further has a support member connecting the frame portion to the at least one lead, the support member being partially molded into the package together with the transducer chip, the at least one island portion, and the at least one lead; and the method includes fixing the at least one lead and the support member to the circuit board.

44. The method of claim 11, including:

bonding the wire to the transducer chip at a bonding position for electrically connecting the transducer chip and the at least one lead; and wherein partially deforming the lead frame along a line extending along a side of the at least one lead with respect to the bonding position.

45. The method of claim 44, wherein partially deforming the lead frame along a line includes partially deforming the lead from along a line which extends between the at least one lead and the bonding position.

46. The method of claim 11, wherein:

the lead frame further has a tie-bar connecting the at least one island portion to the frame portion;

the at least one lead comprises a plurality of leads; and the method includes electrically connecting the plurality of leads to the transducer chip through a plurality of wires which are bonded to a plurality of bonding positions of the transducer, the plurality of bonding positions being arranged approximately on a line parallel to the tie-bar.

47. The method of claim 34, further comprising:

before disposing the transducer chip on the at least one island portion, molding the transducer chip on the at least one island portion along with the at least one lead into a package so that a part of the at least one lead protrudes from the package in a direction non-parallel to the chip mounting surface.

48. A sensor device as in claim 1, wherein the lead further comprises a first portion protruding from the package and a second portion extending in the package in a direction non-parallel to the chip mounting surface.

* * * * *